United States Patent
Pan et al.

(10) Patent No.: US 11,101,445 B2
(45) Date of Patent: Aug. 24, 2021

(54) FLEXIBLE OLED DISPLAY DEVICE HAVING A BENDING ANGLE

(71) Applicant: WUHAN CHINA STAR OPTOELECTRONICS SEMICONDUCTOR DISPLAY TECHNOLOGY CO., LTD., Wuhan (CN)

(72) Inventors: Kun Pan, Wuhan (CN); Xiaoguang Zhu, Wuhan (CN); Shoucheng Wang, Wuhan (CN)

( * ) Notice: Subject to any disclaimer, the term of this patent is extended or adjusted under 35 U.S.C. 154(b) by 388 days.

(21) Appl. No.: 16/320,103

(22) PCT Filed: Dec. 26, 2018

(86) PCT No.: PCT/CN2018/123867
§ 371 (c)(1),
(2) Date: Jan. 24, 2019

(87) PCT Pub. No.: WO2020/113715
PCT Pub. Date: Jun. 11, 2020

(65) Prior Publication Data
US 2021/0184165 A1   Jun. 17, 2021

(30) Foreign Application Priority Data

Dec. 4, 2018 (CN) .......................... 201811474006.7

(51) Int. Cl.
*H01L 51/52* (2006.01)
*H01L 51/00* (2006.01)
*H01L 27/32* (2006.01)
*H01L 33/12* (2010.01)
*H01L 33/44* (2010.01)

(52) U.S. Cl.
CPC ...... *H01L 51/5253* (2013.01); *H01L 27/3244* (2013.01); *H01L 51/0097* (2013.01); *H01L 33/12* (2013.01); *H01L 33/44* (2013.01); *H01L 51/5256* (2013.01); *H01L 2251/5338* (2013.01)

(58) Field of Classification Search
CPC ............ H01L 51/5253; H01L 51/0097; H01L 27/3244; H01L 51/5256; H01L 33/12; H01L 33/44; H01L 2251/5338
See application file for complete search history.

(56) References Cited

U.S. PATENT DOCUMENTS

| | | | | |
|---|---|---|---|---|
| 7,894,124 B2* | 2/2011 | Uchida | ................. | G02F 1/1339 359/296 |
| 8,169,132 B2* | 5/2012 | Oh | ...................... | H01L 51/5256 313/489 |
| 9,343,700 B2* | 5/2016 | Cho | .................... | H01L 51/5253 |

(Continued)

FOREIGN PATENT DOCUMENTS

| CN | 105047829 A | 11/2015 |
|---|---|---|
| CN | 107863452 A | 3/2018 |

*Primary Examiner* — Ida M Soward

(57) ABSTRACT

A flexible OLED display device includes: a flexible substrate, a buffer layer, an OLED light emitting layer, and a thin film encapsulation layer; wherein a portion of the thin film encapsulation layer located in the non-display area has a thickness from a position close to the display area to a position away from the display area The flexible substrate and a portion of the thin film encapsulation layer located in the first bezel area and the second bezel area are bent along a direction away from the display surface.

18 Claims, 5 Drawing Sheets

(56) References Cited

U.S. PATENT DOCUMENTS

| | | | | |
|---|---|---|---|---|
| 9,825,254 | B2* | 11/2017 | Wang | H01L 51/5262 |
| 9,985,245 | B2* | 5/2018 | Wang | H01L 51/56 |
| 10,347,868 | B2* | 7/2019 | Oh | H01L 27/3276 |
| 10,727,424 | B2* | 7/2020 | Tanaka | H01L 27/3276 |
| 10,903,448 | B2* | 1/2021 | Kang | H01L 51/5256 |
| 10,930,887 | B2* | 2/2021 | Lee | H01L 51/56 |
| 2015/0144921 | A1 | 5/2015 | Lim et al. | |
| 2017/0084869 | A1 | 3/2017 | Wang et al. | |
| 2019/0386230 | A1 | 12/2019 | Tang | |

* cited by examiner

FLEXIBLE OLED DISPLAY DEVICE HAVING A BENDING ANGLE

FIELD OF INVENTION

The present disclosure relates to the field of display technologies, and more particularly to a flexible OLED display device.

BACKGROUND OF INVENTION

With rapid developments of information technologies, organic light-emitting diode (OLED) displays as display devices for displaying images have attracted much attention. The urgent demands for OLED with full screens for the market have led to great progresses of flexible display devices from screen size to display quality. Flexible display devices have many advantages, such as impact resistance, strong seismic resistance, light weight, small size, easy to carry, low cost and so on. Current flexible products are also widely used in a field of touch control technology. The touch control technology of flexible touch display panel usually adopts an external design method. An electrode binding of flexible touch display panel usually adopts an external flexible driving circuit binding method. The electrode binding region of flexible OLED display device in the current technology is too large to achieve narrow frame. Therefore, increasing a display region of the display screen has attracted more and more attention, and narrow frame has become more and more important.

In summary, the current flexible OLED displays device, due to the large electrode binding region, causes a width of the outer frame to be too large, which further reduces the display region of a display screen, and cannot achieve a narrow frame.

SUMMARY OF INVENTION

The present disclosure a flexible OLED display device, which makes an edge of the flexible OLED display device and a thin film encapsulation layer fold to a side or back of a display screen, so as to solve the issue that an current flexible OLED display device has too large a width of the outer frame due to a large binding region of the electrodes, which further reduces the display region of the display screen and makes it impossible to realize the technology of narrow border.

In order to solve the above technical issues, the technical scheme provided by the present disclosure is as follows:

The present disclosure provides a flexible organic light-emitting diode (OLED) display device, comprising: a flexible substrate, a buffer layer, a light emitting OLED layer and a thin film encapsulation layer; the flexible substrate comprises a display region and a non-display region disposed at an edge of the display region, the non-display region comprises a first border region, a second border region, a third border region and a fourth border region, the second border region disposed opposite to the first border region, and the third border region disposed opposite to the fourth border region; the thin film encapsulation layer is disposed in the display region and the non-display region, and a thickness of the thin film encapsulation layer in a part of the non-display region decreases sequentially from a position near the display region to a position away from the display region; and the flexible substrate and the thin film encapsulation layer disposed in the first border region and the second border region are bent in a direction away from the display region, and the bending angle is greater than or equal to 90 degrees and less than or equal to 180 degrees.

In a flexible OLED display device provided in an embodiment of the present disclosure, a part of the flexible substrate and a part of the thin film encapsulation layer disposed in the third border region are bent in a direction away from the display region.

In the flexible OLED display device provided in an embodiment of the present disclosure, a part of the flexible substrate and a part of the thin film encapsulation layer disposed in the third border region and the fourth border region are bent in a direction away from the display region.

In the flexible OLED display device provided in an embodiment of the present disclosure, the thin film encapsulation layer comprises a first inorganic encapsulation layer, a first organic encapsulation layer and a second inorganic encapsulation layer disposed layer-by-layer.

In the flexible OLED display device provided in an embodiment of the present disclosure, a boundary of the first organic encapsulation layer is disposed in the first inorganic encapsulation layer.

In the flexible OLED display device provided in an embodiment of the present disclosure, a boundary of the second inorganic encapsulation layer is larger than a boundary of the first organic encapsulation layer, and the boundary of the second inorganic encapsulation layer contacts the boundary of the first inorganic encapsulation layer.

In the flexible OLED display device provided in an embodiment of the present disclosure, the thin film encapsulation layer comprises a third inorganic encapsulation layer, a second organic encapsulation layer, a fourth inorganic encapsulation layer, a third organic encapsulation layer and a fifth inorganic encapsulation layer stacked with one another.

In the flexible OLED display device provided in an embodiment of the present disclosure, a boundary of the second organic encapsulation layer is disposed in the third inorganic encapsulation layer; and a boundary of the third organic encapsulation layer is disposed in the fourth inorganic encapsulation layer.

In the flexible OLED display device provided in an embodiment of the present disclosure, a boundary of the fourth inorganic encapsulation layer is larger than a boundary of the second organic encapsulation layer, and the boundary of the fourth inorganic encapsulation layer contacts the boundary of the third inorganic encapsulation layer; a boundary of the fifth inorganic encapsulation layer is larger than a boundary of the third organic encapsulation layer, and the boundary of the fifth inorganic encapsulation layer contacts a boundary of the fourth inorganic encapsulation layer.

An embodiment of the present disclosure further provides a flexible OLED display device, a flexible organic light-emitting diode (OLED) display device, comprising: a flexible substrate, a buffer layer, a light emitting OLED layer and a thin film encapsulation layer; the flexible substrate comprises a display region and a non-display region disposed at an edge of the display region, the non-display region comprises a first border region, a second border region, a third border region and a fourth border region, the second border region disposed opposite to the first border region, and the third border region disposed opposite to the fourth border region; the thin film encapsulation layer is disposed in the display region and the non-display region, and a thickness of the thin film encapsulation layer in a part of the non-display region decreases sequentially from a position near the display region to a position away from the display region; and the flexible substrate and the thin film encapsulation layer disposed in the first border region and the second border region are bent in a direction away from the display region.

In the flexible OLED display device provided in an embodiment of the present disclosure, a part of the flexible substrate and a part of the thin film encapsulation layer disposed in the third border region are bent in a direction away from the display region.

In the flexible OLED display device provided in an embodiment of the present disclosure, a part of the flexible substrate and a part of the thin film encapsulation layer disposed in the third border region and the fourth border region are bent in a direction away from the display region.

In the flexible OLED display device provided in an embodiment of the present disclosure, the thin film encapsulation layer comprises a first inorganic encapsulation layer, a first organic encapsulation layer and a second inorganic encapsulation layer, disposed layer-by-layer.

In the flexible OLED display device provided in an embodiment of the present disclosure, a boundary of the first organic encapsulation layer is disposed in the first inorganic encapsulation layer.

In the flexible OLED display device provided in an embodiment of the present disclosure, a boundary of the second inorganic encapsulation layer is larger than a boundary of the first organic encapsulation layer, and the boundary of the second inorganic encapsulation layer contacts the boundary of the first inorganic encapsulation layer.

In the flexible OLED display device provided in an embodiment of the present disclosure, the thin film encapsulation layer comprises a third inorganic encapsulation layer, a second organic encapsulation layer, a fourth inorganic encapsulation layer, a third organic encapsulation layer and a fifth inorganic encapsulation layer stacked with one another.

In the flexible OLED display device provided in an embodiment of the present disclosure, a boundary of the second organic encapsulation layer is disposed in the third inorganic encapsulation layer; and a boundary of the third organic encapsulation layer is disposed of the fourth inorganic encapsulation layer.

In the flexible OLED display device provided in an embodiment of the present disclosure, a boundary of the fourth inorganic encapsulation layer is larger than a boundary of the second organic encapsulation layer, and the boundary of the fourth inorganic encapsulation layer contacts a boundary of the third inorganic encapsulation layer; a boundary of the fifth inorganic encapsulation layer is larger than the third organic encapsulation layer, and the boundary of the fifth inorganic encapsulation layer contacts the boundary of the fourth inorganic encapsulation layer.

The beneficial performance of the present disclosure are as follows:

The flexible OLED display device provided by the present disclosure makes a multi-layer thin film encapsulation boundary, and folds the flexible substrate and the thin film encapsulation layer outside the edge of the display region to the side or the back of the display screen, thereby reducing a width of the outer frame, and further, the region of the display region of the display screen is enlarged, and the ultra-narrow bezel of the display screen is further realized.

DESCRIPTION OF DRAWINGS

The accompanying figures to be used in the description of embodiment of the present disclosure or prior art will be described in brief to more clearly illustrate the technical solutions of the embodiment or the prior art. The accompanying figures described below are only part of the embodiment of the present disclosure, from which figures those skilled in the art can derive further figures without manufacturing any inventive efforts.

DETAILED DESCRIPTION OF PREFERRED EMBODIMENTS

Figure 1:
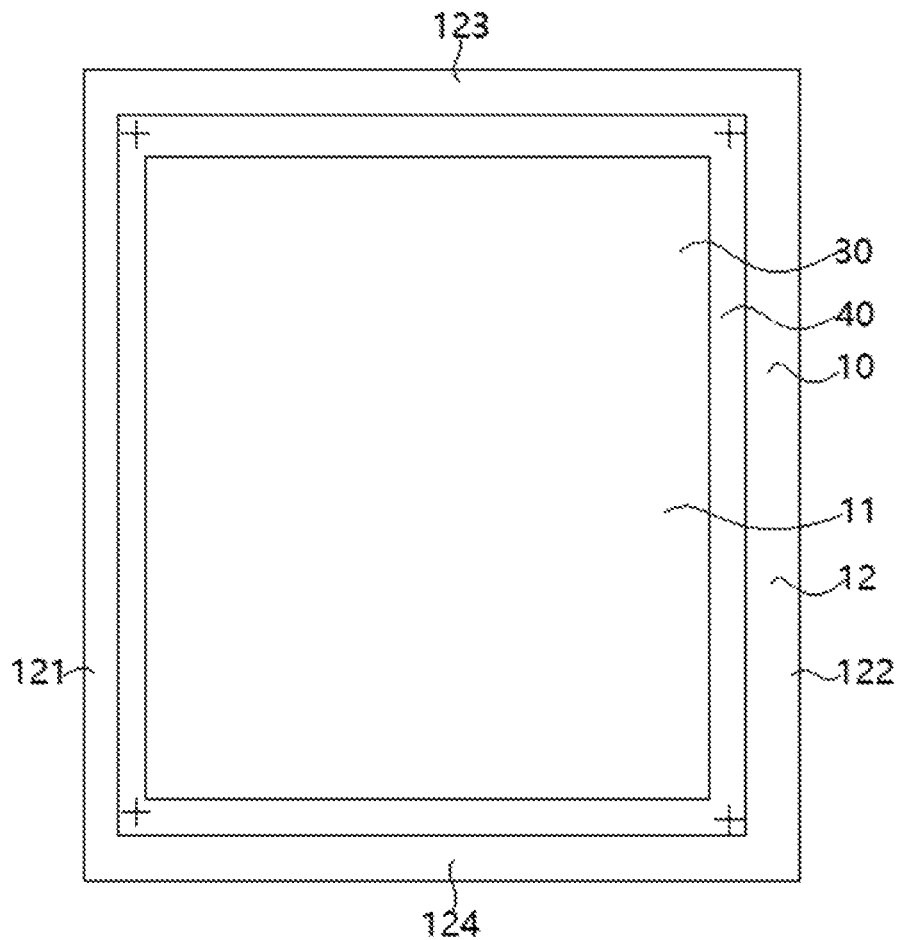
FIG. 1 is a top view for a flexible OLED display device before bending according to a first embodiment of the present disclosure.

The following description of the various embodiments are provided by reference to the accompanying drawings Directional terms mentioned in this application, such as "up", "down", "front", "back", "left", "right", "inside", "outside", "side", etc., are only references Attach the direction of the drawing. Therefore, the directional terminology used is for the purpose of illustration and understanding of the application. In the figures, structurally similar elements are denoted by the same reference numerals.

The present disclosure is directed to an current flexible OLED display device. Since an electrode bonding region is large, a width of the outer frame is too large, and the region of the display screen display region is further reduced, and the technical issues of the narrow frame cannot be realized. This embodiment can solve the drawback.

Figure 2:
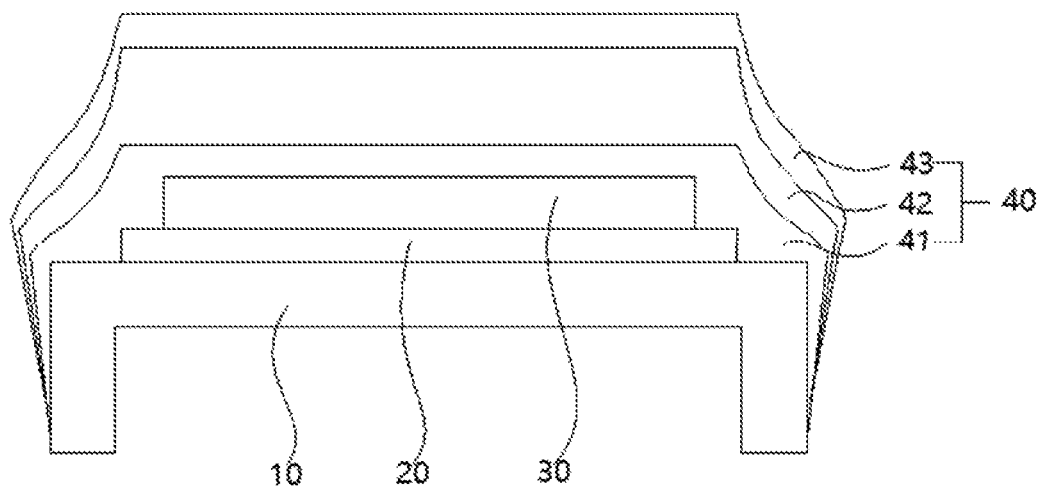
FIG. 2 is a side view of the flexible OLED display device after bending according to the first embodiment of the present disclosure.

As shown in FIG. 1, a top view before bending for a flexible OLED display device according to a first embodiment of the present disclosure. FIG. 2 is a side view after being bent of the flexible OLED display device according to the first embodiment of the present disclosure.

Referring to FIG. 1 and FIG. 2, the present disclosure provides a flexible organic light-emitting diode (OLED) display device, comprising: a flexible substrate 10, a buffer layer 20, a light emitting OLED layer 30 and a thin film encapsulation layer 40; the flexible substrate 10 comprises a display region 11 and a non-display region 12 disposed at an edge of the display region, the non-display region 12 comprises a first border region 121, a second border region 122, a third border region 123 and a fourth border region 124, the second border region 122 disposed opposite to the first border region 121, and the third border region 123 disposed opposite to the fourth border region 124; the thin film encapsulation layer 40 is disposed in the display region 11 and the non-display region 12, and a thickness of the thin film encapsulation layer 40 in a part of the non-display region 12 decreases sequentially from a position near the display region 11 to a position away from the display region and the flexible substrate 10 and the thin film encapsulation layer 40 disposed in the first border region 121 and the second border region 122 are bent in a direction away from the display region 11.

Specifically, the flexible substrate 10 may be a thin metal piece, or may be made of polyimide (PI), polycarbonate (PC), polyether sulfone (PES), or polyethylene terephthalate (Formed from a polymer material such as PET), polyethylene naphthalate (PEN), polyarylate (PAR) or glass fiber reinforced plastic (FRP).

Specifically, the buffer layer 20 is disposed on a surface of the flexible substrate 10 and located in the display region 11. The buffer layer 20 is made of one or two of silicon nitride or silicon oxide.

Specifically, the light emitting OLED layer 30 is disposed on the surface of the buffer layer 20 and located in the display region 11. The light emitting OLED layer 30 generally includes a switching layer (having a plurality of thin film transistors), a flat layer, a pixel defining layer, an anode, a luminescent material layer, a cathode and so on.

Specifically, the thin film encapsulation layer 40 is disposed on the surface of the flexible substrate 10, and the thin film encapsulation layer 40 completely covers the buffer layer 20 and the light emitting OLED layer 30. The thin film encapsulation layer 40 is disposed in the display region 11 and the non-display region 12, and a thickness of the thin film encapsulation layer 40 in a part of the non-display region 12 decreases sequentially from a position near the display region 11 to a position away from the display region 11; and the thin film encapsulation layer 40 comprises a first inorganic encapsulation layer 41, a first organic encapsulation layer 42 and a second inorganic encapsulation layer 43 disposed layer-by-layer.

The first inorganic encapsulation layer 41 is made of an inorganic material, such as an inorganic thin film such as silicon nitride or aluminum oxide; the first inorganic encapsulation layer 41 is a hydrophilic thin film; and the first inorganic encapsulation layer 41 is preferably use a plasma enhanced chemical vapor deposition or an atomic layer deposition to manufacture. The plasma enhanced chemical vapor deposition method is to ionize a gas containing a film constituent atom by means of microwave or radio frequency, and partially forms a plasma, and the plasma chemical activity is strong, and the reaction is easily generated, thereby being deposited a desired film on a surface of the flexible substrate 10. The atomic layer deposition method is a method in which a substance can be plated on the surface of a substrate layer by layer in the form of a monoatomic film.

The material of the first organic encapsulation layer 42 is an organic copolymer, preferably a polyacrylate. The first organic encapsulation layer 42 is formed on the first inorganic encapsulation layer 41 by a spraying technique. A material of the second inorganic encapsulation layer 43 is the same as that of the first inorganic encapsulation layer 41, and the second inorganic encapsulation layer 43 is preferably fabricated by a plasma enhanced chemical vapor deposition method or an atomic layer deposition method.

Specifically, a boundary of the first organic encapsulation layer 42 is disposed in the first inorganic encapsulation layer 41. A boundary of the second inorganic encapsulation layer 43 is larger than a boundary of the first organic encapsulation layer 42, and the boundary of the second inorganic encapsulation layer 43 contacts the boundary of the first inorganic encapsulation layer 41.

Specifically, a part of the flexible substrate 10 and a part of the thin film encapsulation layer 40 disposed in the third border region 123 are bent in a direction away from the display region.

Specifically, a part of the flexible substrate 10 and a part of the thin film encapsulation layer 40 disposed in the third border region 123 and the fourth border region 124 are bent in a direction away from the display region.

Specifically, a bending angle is greater than or equal to 90 degrees and less than or equal to 180 degrees and the bending angle is preferably 90° as shown in FIG. 2.

Figure 3A:
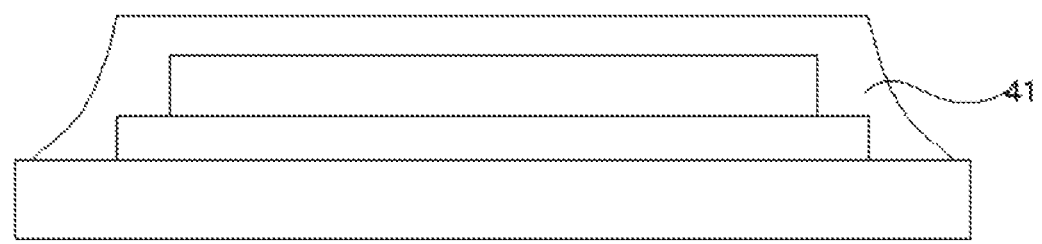
FIG. 3A-3C is a flow chart of the preparation before bending for the flexible OLED display device according to the first embodiment of the present disclosure.

The manufacturing process of the first embodiment of the flexible OLED display device of the present disclosure is described as follows:

First, a flexible substrate 10 is provided on which a buffer layer 20 and an light emitting OLED layer 30 are sequentially deposited. The flexible substrate 10 includes a display region 11 and a non-display region 12, and then the light emitting OLED layer will be completed 30. The flexible substrate 10 after film formation is fed into a chemical vapor deposition cavity, the non-display region 12 at the edge of the display region 11 is provided with a mask, and the mask and the flexibility are controlled. The distance of the substrate 10 is H1, and the first inorganic encapsulation layer 41 is deposited using the mask so that a portion of the first inorganic encapsulation layer 41 located in the non-display region 12 is close to the display region. The position of 11 is sequentially decreased to a position away from the display region 11, as shown in FIG. 3A.

Figure 3B:
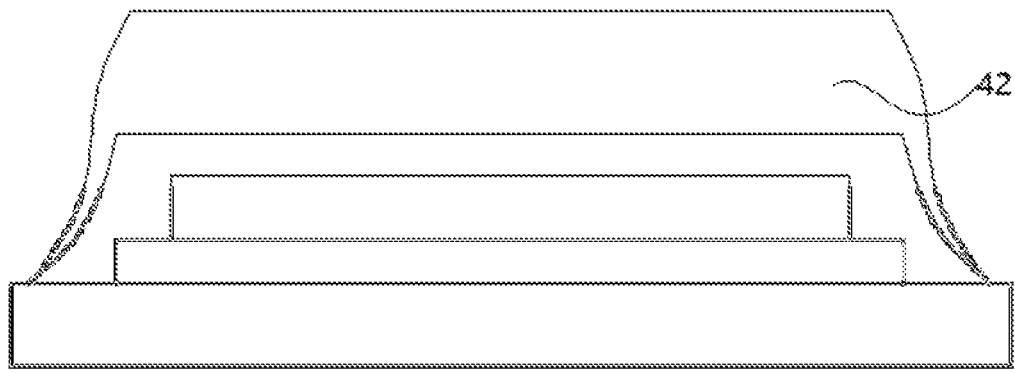

Then, the distance between the mask and the flexible substrate 10 is controlled to be H2, and the first organic encapsulation layer 42 is deposited using the mask so that the thickness of the portion located in the non-display region's 12 the first the organic encapsulation layer 42 is sequentially decreased from a position close to the display region 11 to a position away from the display region 11, and as shown in FIG. 3B, a boundary of the first organic encapsulation layer 42 is ensured to be disposed on the first inorganic encapsulation layer 41.

Figure 3C:
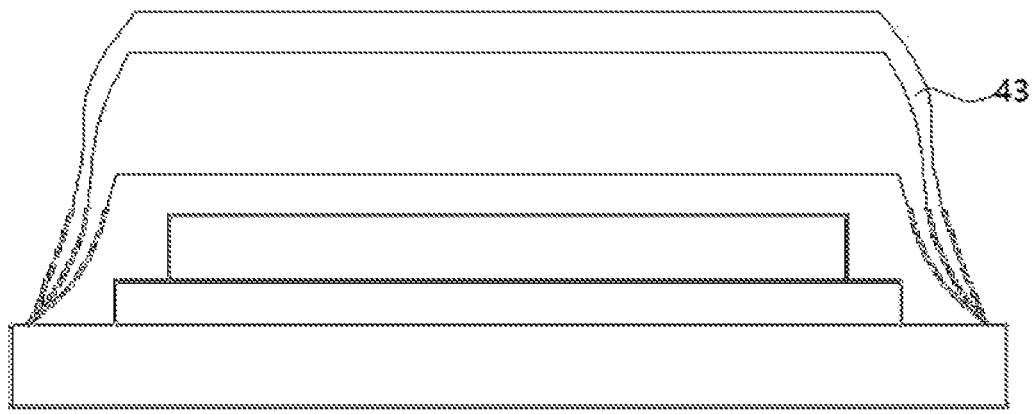

Then, the distance between the mask and the flexible substrate 10 is controlled to be H3, and the second inorganic encapsulation layer 43 is deposited using the mask so that the thickness of the portion located in the non-display region's 12 the second inorganic encapsulation layer 43 is sequentially decreased from a position close to the display region 11 to a position away from the display region 11, and the boundary of the second inorganic encapsulation layer 43 is ensured to be larger than that of the first organic encapsulation layer 41. As shown in FIG. 3C, a boundary, and a boundary of the second inorganic encapsulation layer 43 is in contact with a boundary 41 of the first inorganic encapsulation layer.

Figure 4A:
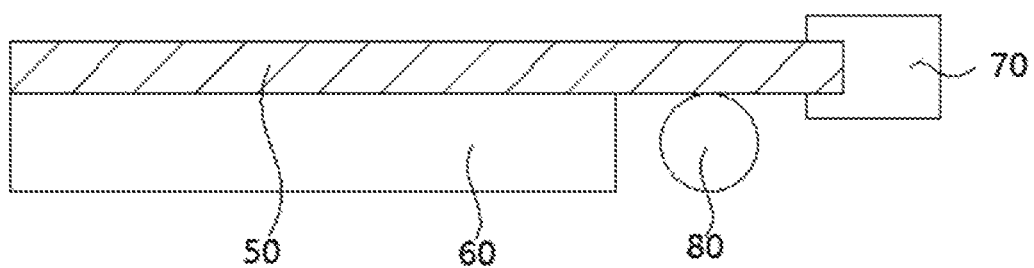
FIG. 4A is a side view of the loading machine before bending for the flexible OLED display device according to the first embodiment of the present disclosure.
Figure 4B:
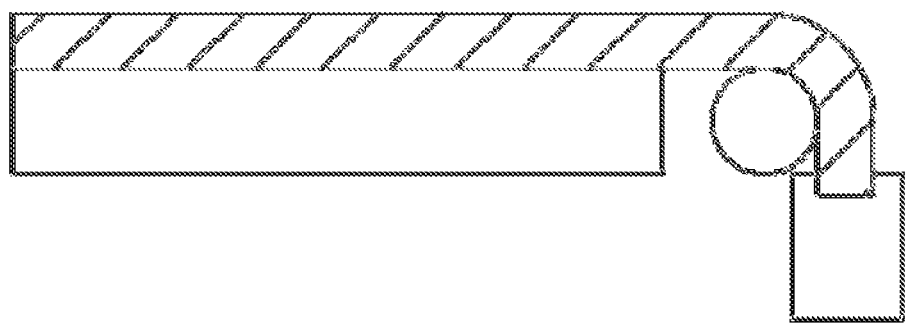
FIG. 4B is a side view of the flexible OLED display device after bending according to the first embodiment of the present disclosure.

After the preparation of the thin film encapsulation layer 40 is completed, the module process flow is proceeded. As shown in FIG. 1, four corners of the edge of the thin film encapsulation layer 40 are provided with alignment marks, and the alignment marks are preferably cross marks. FIG. 4A is a side view of the flexible OLED display device of the present disclosure before being bent on the carrier platform; wherein the completed OLED display device 50 of the thin film encapsulation is placed on the bending platform 60. And vacuum-adsorbing, the edge of the flexible OLED display device 50 is clamped or adhered by a clamp 70, which is a specific material, does not damage the flexible OLED display device 50, and then the flexible OLED is passed through the roller 80. As shown in FIG. 4B, the flexible OLED display device 50 is bent, and the bending angle when the bending is set is greater than or equal to 90° and less than or equal to 180°, and the bending angle is preferably 90°.

Specifically, a portion of the flexible substrate 10 and a portion of the thin film encapsulation layer 40 located in the first frame region 121 and the second frame region 122 are bent along a direction away from the display surface, and are displayed at this time. The display region 11 of the screen is the smallest.

Specifically, a portion of the flexible substrate 10 and a portion of the thin film encapsulation layer 40 located in the first frame region 121, the second frame region 122, and the third frame region 123 and is bent along a direction opposite to the display plane.

Specifically, a portion of the flexible substrate 10 and a portion of the film located in the first frame region 121, the second frame region 122, the third frame region 123, and the fourth frame region 124 may also be The encapsulation layer 40 is bent in a direction away from the display surface, at which time the display region 11 of the display screen is the largest.

Figure 5:
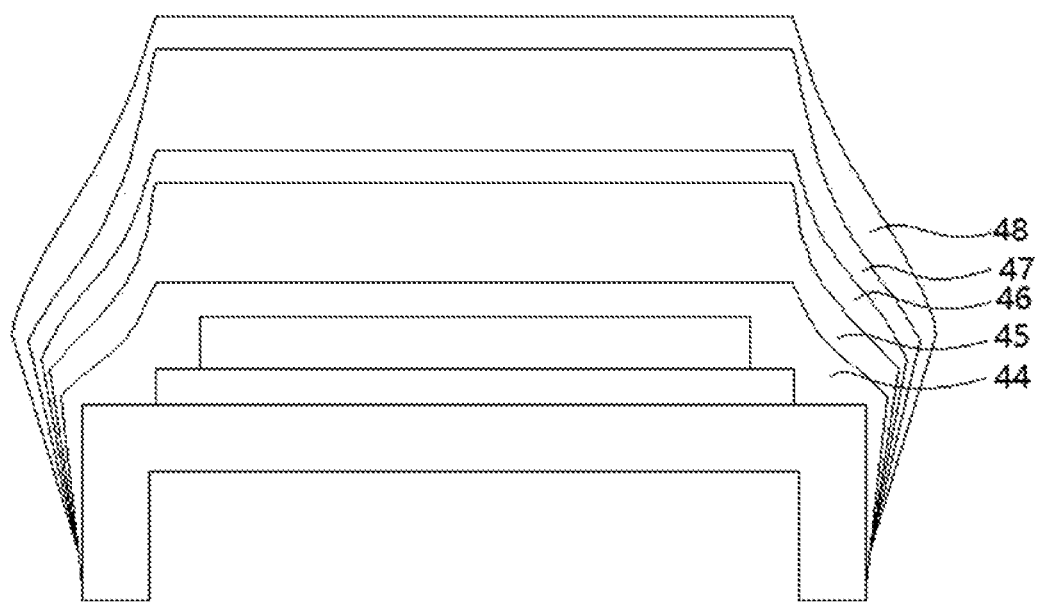
FIG. 5 is a side view of the flexibility OLED display device after bending according to a second embodiment of the present disclosure.

As shown in FIG. 5, it is a side view after being bent of the flexible OLED display device of the present disclosure. The thin film encapsulation layer includes a third inorganic encapsulation layer 44, a second organic encapsulation layer 45, a fourth inorganic encapsulation layer 46, a third organic encapsulation layer 47, and a fifth inorganic encapsulation layer 48.

Specifically, a boundary of the second organic encapsulation layer 45 is disposed inside the third inorganic encapsulation layer 44; a boundary of the third organic encapsulation layer 47 is disposed inside the fourth inorganic encapsulation layer 46.

Specifically, a boundary of the fourth inorganic encapsulation layer 46 is larger than a boundary of the second organic encapsulation layer 45, and a boundary of the fourth inorganic encapsulation layer 46 is in contact with a boundary of the third inorganic encapsulation layer 44; The boundary of the fifth inorganic encapsulation layer 48 is larger than the boundary of the third organic encapsulation layer 47, and the boundary of the fifth inorganic encapsulation layer 48 is in contact with the boundary of the fourth inorganic encapsulation layer 46.

The manufacturing process of the second embodiment of the flexible OLED display device of the present disclosure is the same as that of the first embodiment, and will not be repeatedly described herein.

The flexible OLED display device of the present disclosure prepares the boundary of the thin film encapsulation layer with a thick gradient by adjusting the spacing between the mask and the substrate, thereby improving the bending resistance of the thin layer, thereby achieving a large angle bend of the edge of the display region, and further Can achieve ultra-narrow borders or no borders.

The beneficial performance of the present disclosure are as follows: the flexible OLED display device provided by the present disclosure makes a multi-layer thin film encapsulation layer boundary, and folds the flexible substrate and the thin film encapsulation layer outside the edge of the display region to the side or the back of the display screen. The width of the outer frame is reduced, and the region of the display region of the display screen is further enlarged, thereby further realizing the ultra-narrow border of the display screen.

In the above, although the present disclosure has been disclosed in the above preferred embodiment, the preferred embodiment are not intended to limit the present application, and those skilled in the art can make various modifications without departing from the spirit and scope of the present application. The invention is modified and retouched, and the scope of protection of the present application is determined by the scope defined by the claims.

What is claimed is:

1. A flexible organic light-emitting diode (OLED) display device, comprising:
   a flexible substrate comprising a display region and a non-display region disposed at the edge of the display region, the non-display region comprises a first border region, a second border region, a third border region and a fourth border region, the second border region disposed opposite to the first border region, and the third border region disposed opposite to the fourth border region;
   a buffer layer disposed to a surface of the flexible substrate and the buffer layer disposed in the display region;
   a light emitting OLED layer disposed on a surface of the buffer layer;
   a thin film encapsulation layer disposed on the surface of the flexible substrate, and the thin film encapsulation layer completely covers the buffer layer and the light emitting OLED layer, the thin film encapsulation layer is disposed in the display region and the non-display region, and a thickness of the thin film encapsulation layer in a part of the non-display region decreases sequentially from a position near the display region to a position away from the display region; and
   wherein the flexible substrate and the thin film encapsulation layer disposed in the first border region and the second border region are bent in a direction away from the display region, and the bending angle is greater than or equal to 90 degrees and less than or equal to 180 degrees.

2. The flexible OLED display device according to claim 1, wherein a part of the flexible substrate and a part of the thin film encapsulation layer disposed in the third border region are bent in a direction away from the display region.

3. The flexible OLED display device according to claim 1, wherein a part of the flexible substrate and a part of the thin film encapsulation layer disposed in the third border region and the fourth border region are bent in a direction away from the display region.

4. The flexible OLED display device according to claim 1, wherein the thin film encapsulation layer comprises a first inorganic encapsulation layer, a first organic encapsulation layer and a second inorganic encapsulation layer disposed layer-by-layer.

5. The flexible OLED display device according to claim 4, wherein a boundary of the first organic encapsulation layer is disposed in the first inorganic encapsulation layer.

6. The flexible OLED display device according to claim 4, wherein a boundary of the second inorganic encapsulation layer is larger than a boundary of the first organic encapsulation layer, and the boundary of the second inorganic encapsulation layer contacts the boundary of the first inorganic encapsulation layer.

7. The flexible OLED display device according to claim 1, wherein the thin film encapsulation layer comprises a third inorganic encapsulation layer, a second organic encapsulation layer, a fourth inorganic encapsulation layer, a third organic encapsulation layer and a fifth inorganic encapsulation layer stacked with one another.

8. The flexible OLED display device according to claim 7, wherein a boundary of the second organic encapsulation layer is disposed in the third inorganic encapsulation layer; and a boundary of the third organic encapsulation layer is disposed in the fourth inorganic encapsulation layer.

9. The flexible OLED display device according to claim 7, wherein a boundary of the fourth inorganic encapsulation layer is larger than a boundary of the second organic encapsulation layer, and the boundary of the fourth inorganic encapsulation layer contacts a boundary of the third inorganic encapsulation layer; a boundary of the fifth inorganic encapsulation layer is larger than the boundary of the third organic encapsulation layer, and the boundary of the fifth inorganic encapsulation layer contacts the boundary of the fourth inorganic encapsulation layer.

10. A flexible organic light-emitting diode (OLED) display device, comprising:
  a flexible substrate comprising a display region and a non-display region disposed at the edge of the display region, the non-display region comprises a first border region, a second border region, a third border region and a fourth border region, the second border region disposed opposite to the first border region, and the third border region disposed opposite to the fourth border region;
  a buffer layer disposed to a surface of the flexible substrate and the buffer layer disposed in the display region;
  an light emitting OLED layer disposed on a surface of the buffer layer;
  a thin film encapsulation layer disposed on the surface of the flexible substrate, and the thin film encapsulation layer completely covers the buffer layer and the light emitting OLED layer, the thin film encapsulation layer is disposed in the display region and the non-display region, and a thickness of the thin film encapsulation layer in the part of the non-display region decreases sequentially from a position near the display region to a position away from the display region; and
  wherein the flexible substrate and the thin film encapsulation layer disposed in the first border region and the second border region are bent in a direction away from the display region.

11. The flexible OLED display device according to claim 10, wherein a part of the flexible substrate and a part of the thin film encapsulation layer disposed in the third border region are bent in a direction away from the display region.

12. The flexible OLED display device according to claim 10, wherein a part of the flexible substrate and a part of the thin film encapsulation layer disposed in the third border region and the fourth border region are bent in a direction away from the display region.

13. The flexible OLED display device according to claim 10, wherein the thin film encapsulation layer comprises a first inorganic encapsulation layer, a first organic encapsulation layer and a second inorganic encapsulation layer, disposed layer-by-layer.

14. The flexible OLED display device according to claim 13, wherein a boundary of the first organic encapsulation layer is disposed in the first inorganic encapsulation layer.

15. The flexible OLED display device according to claim 13, wherein a boundary of the second inorganic encapsulation layer is larger than a boundary of the first organic encapsulation layer, and the boundary of the second inorganic encapsulation layer contacts the boundary of the first inorganic encapsulation layer.

16. The flexible OLED display device according to claim 10, wherein the thin film encapsulation layer comprises a third inorganic encapsulation layer, a second organic encapsulation layer, a fourth inorganic encapsulation layer, a third organic encapsulation layer and a fifth inorganic encapsulation layer stacked with one another.

17. The flexible OLED display device according to claim 16, wherein a boundary of the second organic encapsulation layer is disposed in the third inorganic encapsulation layer; and a boundary of the third organic encapsulation layer is disposed of the fourth inorganic encapsulation layer.

18. The flexible OLED display device according to claim 16, wherein a boundary of the fourth inorganic encapsulation layer is larger than a boundary of the second organic encapsulation layer, and the boundary of the fourth inorganic encapsulation layer contacts a boundary of the third inorganic encapsulation layer; a boundary of the fifth inorganic encapsulation layer is larger than the boundary of the third organic encapsulation layer, and the boundary of the fifth inorganic encapsulation layer contacts the boundary of the fourth inorganic encapsulation layer.

* * * * *